United States Patent
Takashima et al.

(10) Patent No.: US 8,331,137 B2
(45) Date of Patent: Dec. 11, 2012

(54) NONVOLATILE SEMICONDUCTOR MEMORY DEVICE

(75) Inventors: Akira Takashima, Fuchu (JP); Reika Ichihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/234,796

(22) Filed: Sep. 16, 2011

(65) Prior Publication Data
US 2012/0243293 A1 Sep. 27, 2012

(30) Foreign Application Priority Data
Mar. 22, 2011 (JP) ................................. 2011-063352

(51) Int. Cl.
*G11C 11/00* (2006.01)

(52) U.S. Cl. ... 365/163; 365/133; 365/148; 365/185.19; 365/233.1

(58) Field of Classification Search .................. 365/163, 365/133, 148, 185.19, 233.1
See application file for complete search history.

(56) References Cited

U.S. PATENT DOCUMENTS

| | | | |
|---|---|---|---|
| 7,948,790 B2 | 5/2011 | Tsukamoto et al. | |
| 2006/0087876 A1* | 4/2006 | Cho et al. | 365/148 |
| 2010/0237314 A1 | 9/2010 | Tsukamoto et al. | |
| 2011/0026299 A1 | 2/2011 | Kanno et al. | |
| 2011/0032745 A1 | 2/2011 | Ichihara et al. | |
| 2011/0069532 A1 | 3/2011 | Ichihara et al. | |
| 2011/0103128 A1 | 5/2011 | Kanno et al. | |
| 2011/0216574 A1 | 9/2011 | Ichihara et al. | |

FOREIGN PATENT DOCUMENTS
JP  2006-344349  12/2006

OTHER PUBLICATIONS
U.S. Appl. No. 13/239,899, filed Sep. 22, 2011, Ichihara, et al.
U.S. Appl. No. 13/053,677, filed Mar. 22, 2011, Reika Ichihara.
Akihito Sawa, "Nonvolatile Resistance-Switching Memory in Transition-Metal Oxides (ReRam)", Oyo Butsuri, vol. 75, 2006, 6 pages.

* cited by examiner

*Primary Examiner* — Jason Lappas
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell includes a variable resistance element and a capacitor connected in series between first and second conductive lines, and a control circuit applying one of first and second voltage pulses to the memory cell. The capacitor is charged by a leading edge of one of the first and second voltage pulses, and discharged a trailing edge of one of the first and second voltage pulses. The control circuit makes waveforms of the trailing edges of the first and second voltage pulses be different, changes a resistance value of the variable resistance element from a first resistance value to a second resistance value by using the first voltage pulse, and changes the resistance value of the variable resistance element from the second resistance value to the first resistance value by using the second voltage pulse.

16 Claims, 15 Drawing Sheets

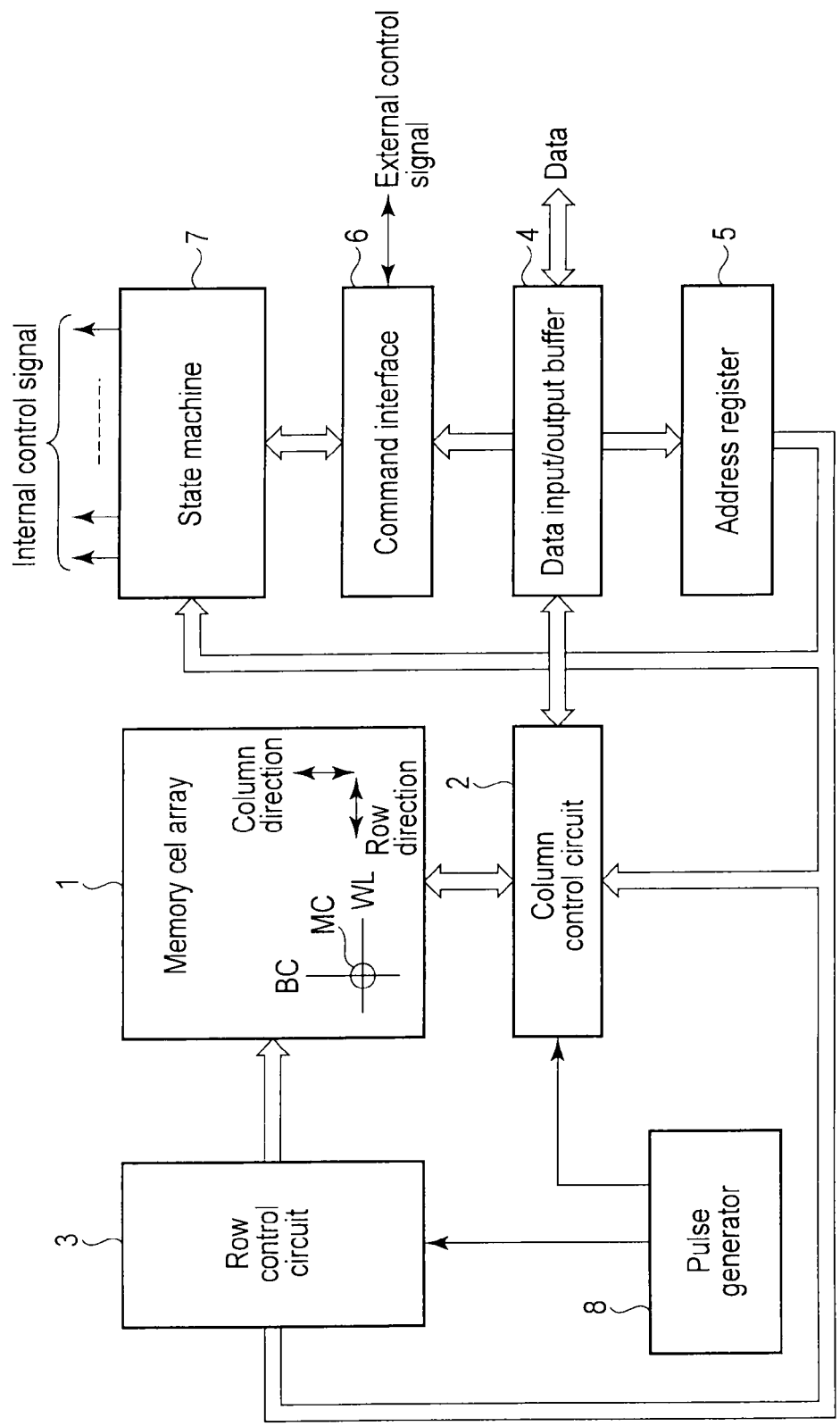
F I G. 1

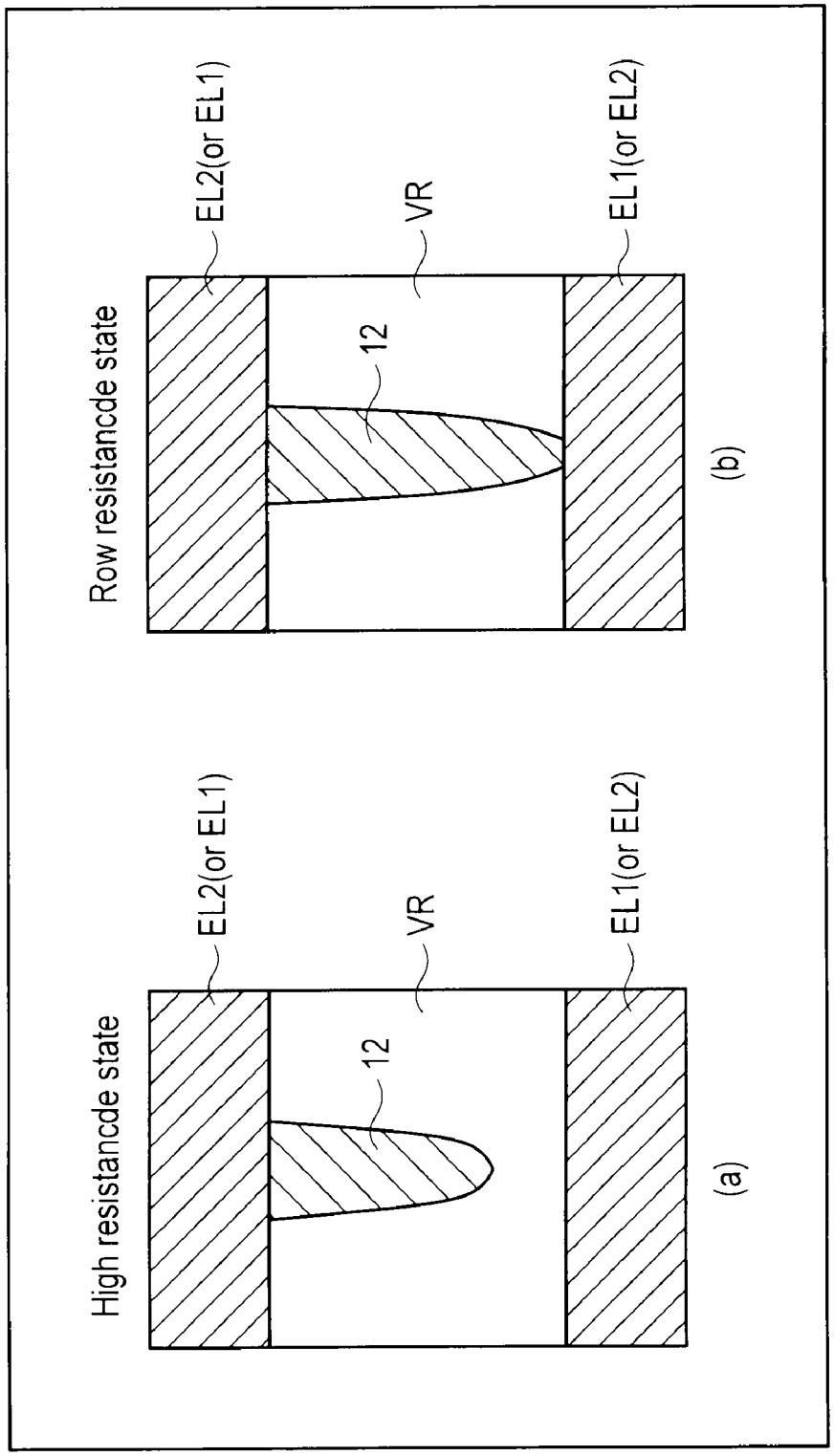
F I G. 4

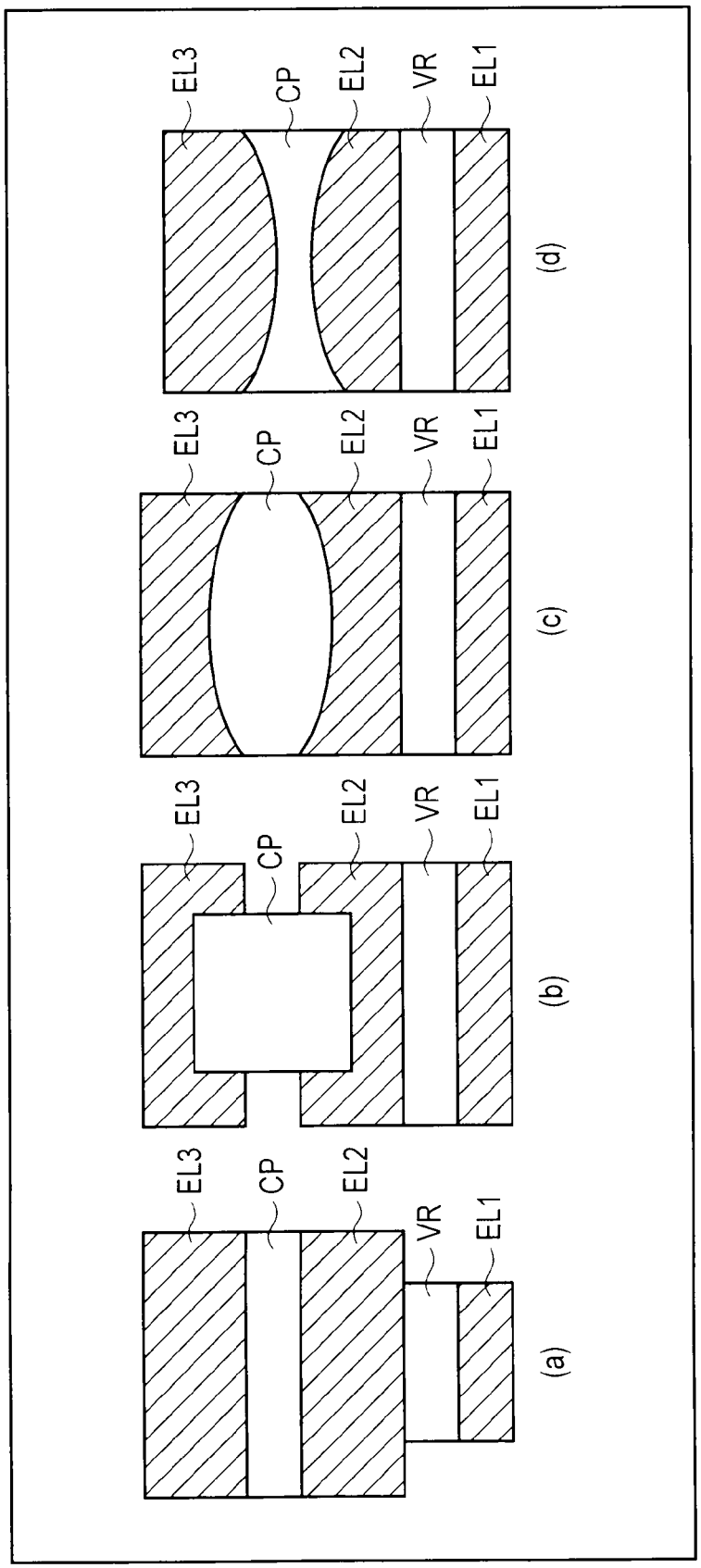
F I G. 5

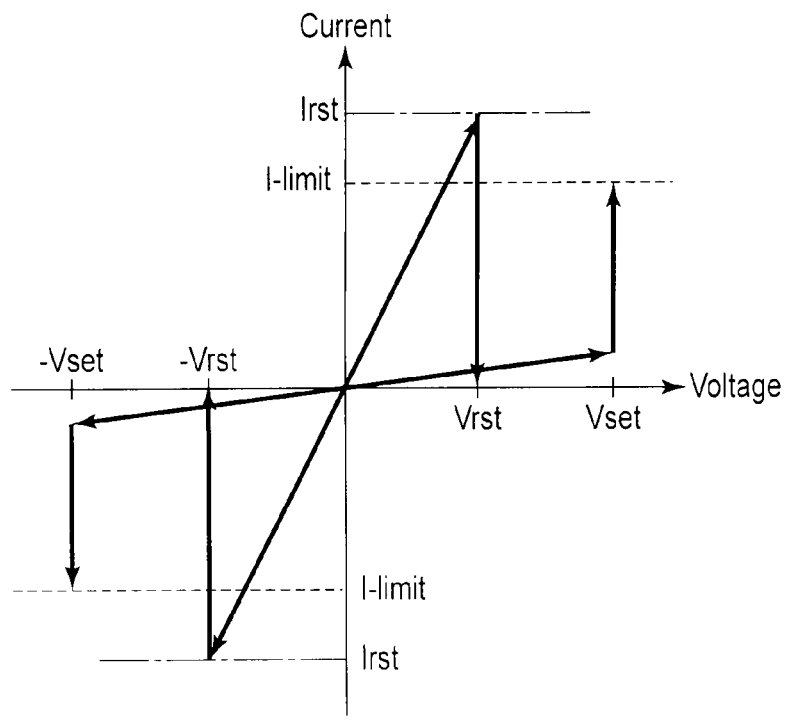
F I G. 7
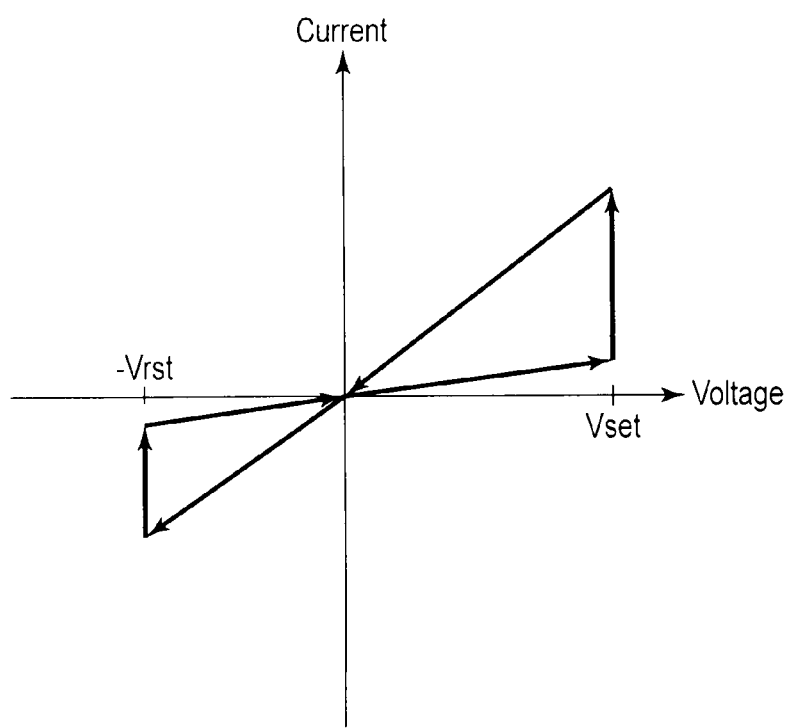
F I G. 8

| | | State-1 | State-2 | State-3 | State-4 |
|---|---|---|---|---|---|
| Write | Selected bit line BL1 | 0V | V1 | V2 | 0V |
| | Unselected bit line BL0, BL2, BL3 | 0V | V2 | 0V | 0V |
| | Selected word line WL1 | 0V | 0V | 0V | 0V |
| | Unselected word line WL0, WL2, WL3 | 0V | V2 | 0V | 0V |
| Erase | Selected bit line BL1 | 0V | V1 | → | 0V |
| | Unselected bit line BL0, BL2, BL3 | 0V | V2 | → | 0V |
| | Selected word line WL1 | 0V | 0V | → | 0V |
| | Unselected word line WL0, WL2, WL3 | 0V | V2 | → | 0V |

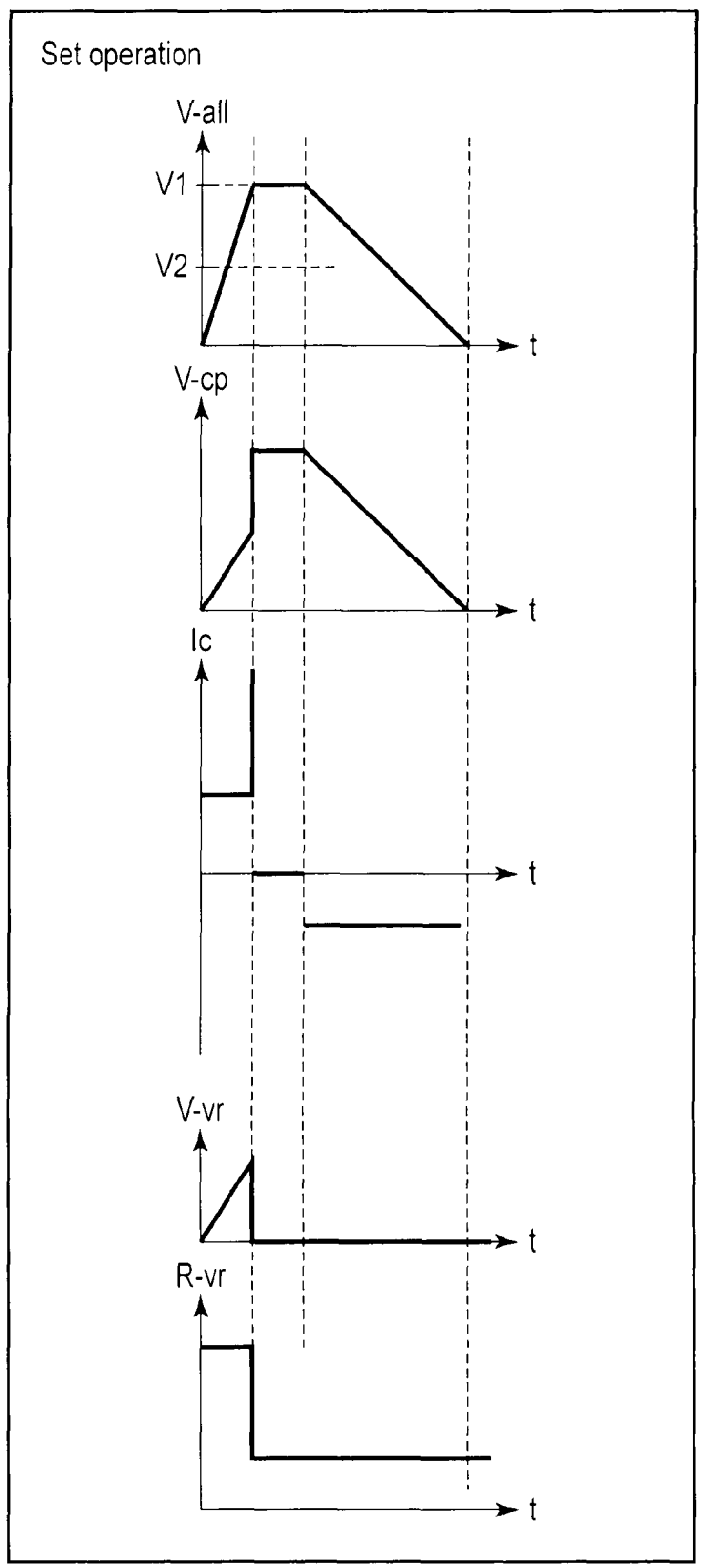
F I G. 15

|  |  | State-1 | State-2 | State-3 | State-4 |
|---|---|---|---|---|---|
| Write | Selected bit line BL1 | 0V | V1 | V2 | 0V |
|  | Unselected bit line BL0, BL2, BL3 | 0V | V2 | 0V | 0V |
|  | Selected word line WL1 | 0V | 0V | 0V | 0V |
|  | Unselected word line WL0, WL2, WL3 | 0V | V2 | 0V | 0V |
| Erase | Selected bit line BL1 | 0V | V1' | → | 0V |
|  | Unselected bit line BL0, BL2, BL3 | 0V | V3 | → | 0V |
|  | Selected word line WL1 | 0V | 0V | → | 0V |
|  | Unselected word line WL0, WL2, WL3 | 0V | V3 | → | 0V |
F I G. 17
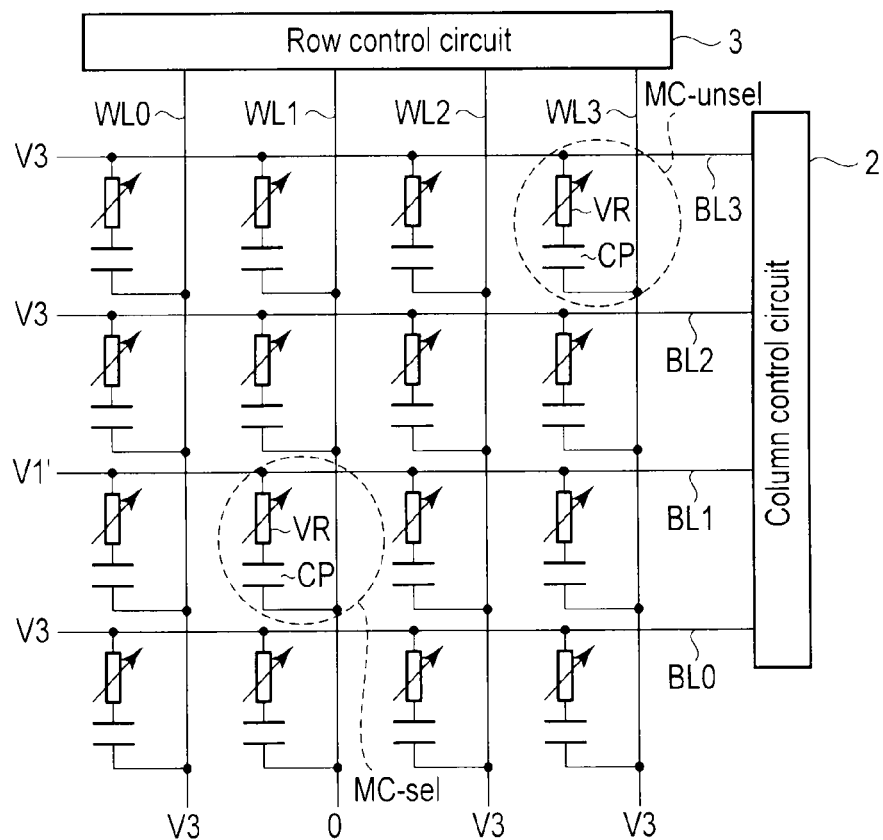
F I G. 18

|  |  | State-1 | State-2 | State-3 | State-4 |
|---|---|---|---|---|---|
| Write | Selected bit line BL1 | 0V | V1 | V2 | 0V |
|  | Unselected bit line BL0, BL2, BL3 | 0V | V2 | 0V | 0V |
|  | Selected word line WL1 | 0V | 0V | 0V | 0V |
|  | Unselected word line WL0, WL2, WL3 | 0V | V2 | 0V | 0V |
| Erase | Selected bit line BL1 | 0V | V1 | → | 0V |
|  | Unselected bit line BL0, BL2, BL3 | 0V | V2 | → | 0V |
|  | Selected word line WL1 | 0V | 0V | → | V4 |
|  | Unselected word line WL0, WL2, WL3 | 0V | V2 | → | 0V |

NONVOLATILE SEMICONDUCTOR MEMORY DEVICE

CROSS-REFERENCE TO RELATED APPLICATIONS

This application is based upon and claims the benefit of priority from prior Japanese Patent Application No. 2011-063352, filed Mar. 22, 2011, the entire contents of which are incorporated herein by reference.

FIELD

Embodiments described herein relate generally to a nonvolatile semiconductor memory device.

BACKGROUND

A resistance random access memory using variable resistance elements is suggested. The resistance random access memory may comprise so-called cross-point type memories, in which memory cells each having a variable resistance element and a selector connected to each other in series are arranged in intersections of bit lines and word lines. Therefore, produced is an advantage that such memories are easily stacked into a three-dimensional structure so that the resultant can attain a high capacity.

The variable resistance element makes it possible to set resistance values by controlling the value of a voltage to be applied thereto, and the time for the application. The selector is a rectifier for avoiding a disturbance associated with adjacent memory cells, and may be a diode, a varistor, or some other device.

When data is rewritten in the memory cells, a voltage applied to the memory cell is distributed to the variable resistance element and the selector. The value thereof is decided in accordance with the ratio between resistance values of the variable resistance element and the selector or between capacity values thereof. When data is written therein, the voltage distributed in the variable resistance element is decreased at the moment when the set operation of the variable resistance element is finished, so that the voltage distributed to the selector is increased. As a result, most of the voltage applied to the memory cell is concentrated into the selector. When the data is erased therefrom, most of the voltage applied to the memory cell is concentrated in the selector for a predetermined time until the reset operation of the variable resistance element is finished. In short, most of the voltage applied to the memory cell when data is rewritten therein is concentrated in the selector. For this reason, the selector is required to have a resistance against high voltage. When the selector cannot endure a voltage so that a current (leakage current) penetrating through the selector increases remarkably, it becomes difficult to maintain the reliability of the selector. As a result, the selector may undergo dielectric breakdown.

BRIEF DESCRIPTION OF THE DRAWINGS

FIG. 1 is a diagram illustrating a nonvolatile semiconductor memory device;
FIG. 4 is a view illustrating an example of a variable resistance element;
FIG. 5 is a view illustrating an example of a selector;
FIG. 7 is a view referred to in order to describe the operation of a monopolar type variable resistance element;
FIG. 8 is a view referred to in order to describe the operation of a bipolar type variable resistance element;
FIGS. 14 and 15 are each a waveform chart referred to in order to describe the set operation;
FIG. 17 is a diagram showing a second example of the set/reset operations;
FIG. 18 is a view showing a relationship between voltages when the reset operation is made.

DETAILED DESCRIPTION

Figure 2:
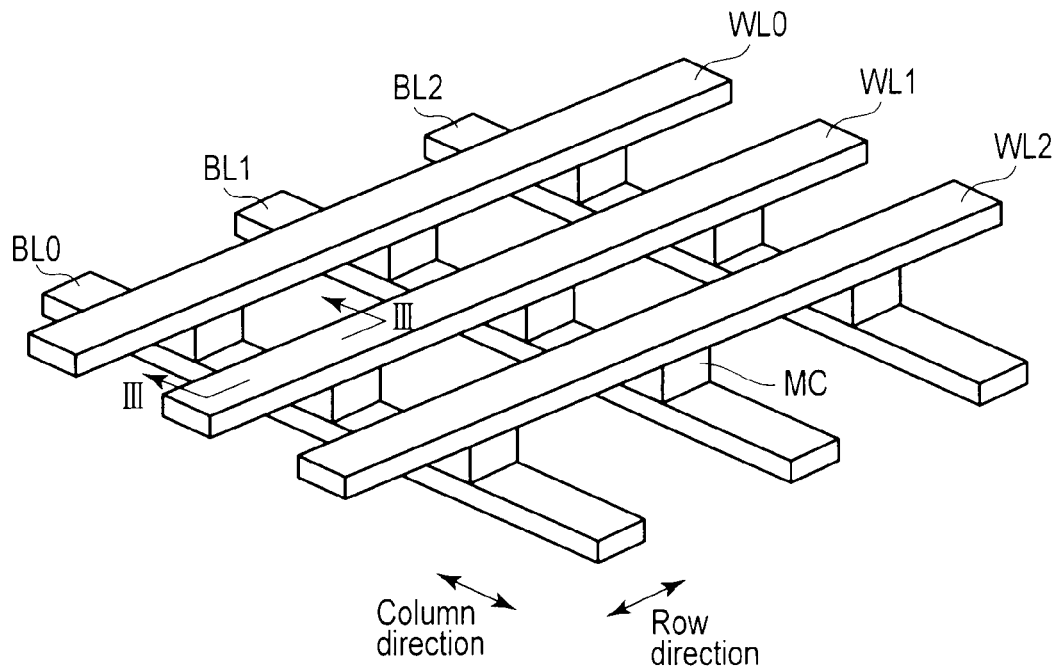
FIG. 2 is a view illustrating a memory cell array.

In general, according to one embodiment, a nonvolatile semiconductor memory device comprising: first and second conductive lines intersecting each other; a memory cell comprising a variable resistance element and a capacitor connected in series between the first and second conductive lines; and a control circuit applying one of first and second voltage pulses to the memory cell, wherein the capacitor is charged by a leading edge of one of the first and second voltage pulses, and discharged a trailing edge of one of the first and second voltage pulses, wherein the control circuit makes the trailing edge waveforms of the first and second voltage pulses be different, changes a resistance value of the variable resistance element from a first resistance value to a second resistance value lower than the first resistance value by using the first voltage pulse, and changes the resistance value of the variable resistance element from the second resistance value to the first resistance value by using the second voltage pulse.

Hereinafter, embodiments will be described with reference to the drawings.

BASIC STRUCTURE

In one of the embodiments, a variable resistance element and a capacitor that constitute a memory cell are connected to each other in series between first and second conductive lines intersecting each other. The capacitor is charged by a leading edge of one of first and second voltage pulses, and discharged by a trailing edge of one of the first and second voltage pulses. The control circuit makes waveforms of the trailing edges of the first and second voltage pulses different, changes a resistance value of the variable resistance element from a first resistance value to a second resistance value by using the first voltage pulse, and changes the resistance value of the variable resistance element from the second resistance value to the first resistance value by using the second voltage pulse.

For example, when the first resistance value is the higher resistance value and the second resistance value is lower than the first resistance value, an operation for changing the resistance value of the variable resistance element from the first resistance value to the second resistance value is called a writing operation (set operation). An operation for changing the resistance value reversely from the second resistance value to the first resistance value is called an erasing operation (reset operation).

At this time, the first voltage pulse is a set pulse, and the second voltage pulse is a reset pulse.

When the first resistance value is made into a reset state (high resistance state) and the second resistance value is made into a set state (low resistance state), it is possible to prepare set (sub)states as the set state to make the second resistance value into multi-values. For example, it is also possible to prepare third, fourth, . . . voltage pulses, thereby changing the resistance value of the variable resistance element to a third resistance value through the third voltage pulse and changing the resistance value of the variable resistance element to a fourth resistance value through the fourth voltage pulse.

About the reset operation, however, regardless of the resistance states of the variable resistance elements (the resistance values of second, third, fourth, . . . states), the variable resistance elements that are each in all the resistance states are changed together to have the first resistance value through the second voltage pulse.

The trailing time of the second voltage pulse is shorter than that of the first voltage pulse. For example, the trailing edge waveform of the first voltage pulse is made into one of a stair form and a slope form, whereby the time-relationship described just above can be attained.

A plural of the second voltage pulse may function as a rendered pulse like the first voltage pulse, so that the memory cell may be reset by totalizing the trailing times of the second voltage pulses.

The control circuit may make the trailing edge waveform of the first voltage pulse into the form of stairs including first and second steps, and at this time the control circuit makes use of a discharge current from the capacitor that is generated when the first voltage pulse is shifted from the first step to the second step, thereby verifying whether or not the variable resistance element has the second resistance value.

The control circuit may also make the trailing edge waveform of the first voltage pulse into the form of stairs including first and second steps, and at this time the control circuit makes use of a discharge current from the capacitor that is generated when the first voltage pulse is shifted from the first step to the second step, thereby changing the resistance value of the variable resistance element into the first resistance value.

When the trailing edge waveform of the first voltage pulse further includes third and fourth steps, the control circuit makes use of a discharge current from the capacitor that is generated when the first voltage pulse is shifted from the third step to the fourth step, thereby verifying whether or not the variable resistance element has the first resistance value.

Apart from the above, the variable resistance element comprises first and second electrodes, and a variable resistance material between these electrodes. The resistance value of the variable resistance element is decided by form-factors (such as the length and thickness) of a filament formed between the first and second electrodes and having the same element as the first electrode has.

Specifically, the variable resistance material is amorphous silicon, polycrystalline silicon or a metal sulfide.

The first electrode comprises at least one of Ag, Ni, Co, Pb, Al, Ge, Mo, W, Ti, Fe, Cu, and Zn.

In the capacitor, it is desired that the following is used as a high dielectric-constant film: an oxide containing at least one of Ti, Zr, Hf, Ta, La and Pr; or a material in which at least one of Si, Al and N is mixed with the oxide.

It is desired that the capacity of the capacitor is larger than the capacity of the variable resistance element when the variable resistance element is in the high resistance state. Thus, the capacitor is desirably thinner than the variable resistance element. More precisely, the distance between electrodes in the capacitor is desirably shorter than the distance between electrodes in the variable resistance element.

The resistance value of the variable resistance element may be changed to the second resistance value by transient current in the charge of the capacitor that is based on the leading edge of the first voltage pulse. The resistance value of the variable resistance element may be also changed to the first resistance value by transient current in the charge of the capacitor that is based on the leading edge of the second voltage pulse.

The variable resistance element may be of a bipolar type or a monopolar type.

STRUCTURE OF NONVOLATILE SEMICONDUCTOR MEMORY DEVICE

FIG. 1 is a block view of a nonvolatile semiconductor memory device. The nonvolatile semiconductor memory device is, for example, a flash memory.

Memory cell array 1 has memory cells MC arranged between word lines WL and bit lines BL. Memory cells MC each have a variable resistance element and a capacitor functioning as a selector. The variable resistance element and the capacitor are connected to each other in series.

Column control circuit 2 is fitted to an end in the bit-line-BL-extended direction of memory cell array 1. Column control circuit 2 controls voltages of bit lines BL in the reading, writing and erasing of data from/into memory cells MC.

Low control circuit 3 is fitted to an end in the word-line-WL-extended direction of memory cell array 1. Low control circuit 3 controls voltages of word lines WL in the reading, writing and erasing of data from/into memory cells MC.

Data input/output buffer 4 interchanges data with an external host. Examples of the data include command data for reading, writing, and erasing, address data, and reading/writing data. Data input/output buffer 4 transfers writing data to column control circuit 2, and outputs reading data from column control circuit 2 to the external host.

Any address data is passed through data input/output buffer 4 into address resistor 5, and is temporarily memorized therein. Moreover, any address data is transferred to column control circuit 2 and row control circuit 3. Any command data is passed through data input/output buffer 4 to be transferred to command interface 6. Command interface 6 receives a control signal from the external host, and determines the kind of the data input into data input/output buffer 4. When the data is command data, the command data is transferred to state machine 7.

State machine 7 manages all the operations of the nonvolatile semiconductor memory device, for example, reading, writing, erasing, and input and output of data. The external host receives status information that state machine 7 manages, and makes it possible to determine an operation result. The status information is also used for the control of writing and erasing.

State machine 7 also controls pulse generator 8, which is a portion of the control circuit. This control makes it possible for pulse generator 8 to output an arbitrary voltage and also output a pulse at an arbitrary timing.

For example, address data is supplied from address resistor 5 to state machine 5; thus, state machine 7 can determine a selected memory cell, which is a target for reading/writing, in memory cell array 1. Pulse generator 8 generates a voltage pulse for this selected memory cell. The generated voltage pulse may be transferred to a predetermined one of word lines WL, and a predetermined one of bit lines BL by the effect of column control circuit 2 and row control circuit 3.

Memory cell array 1 is of a so-called cross point type, and may be made into, for example, a three-dimensional structure. In this case, peripheral circuits other than memory cell array 1 may be formed in the silicon substrate positioned just below memory cell array 1. This makes it possible to make the area of a chip of the nonvolatile semiconductor memory device substantially equal to that of memory cell array 1.

Figure 3:
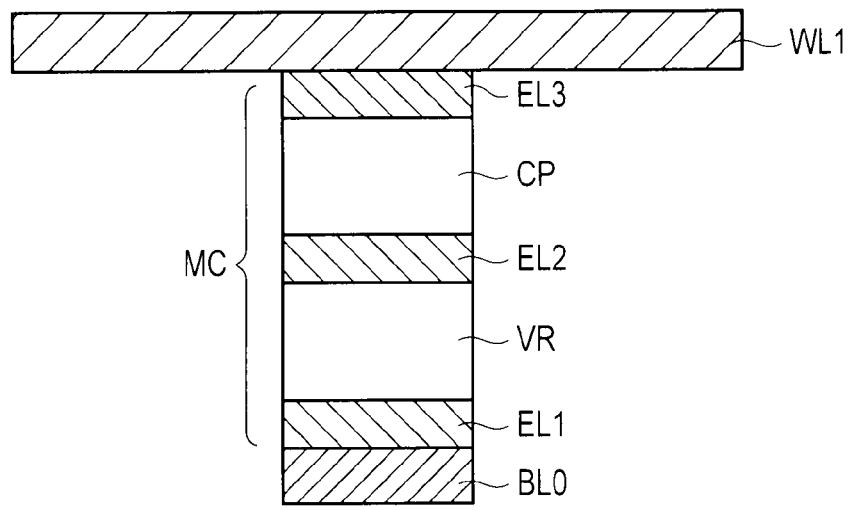
FIG. 3 is a sectional view of the array taken along line in FIG. 2.

FIG. 2 is a partial perspective view of memory cell array 1. FIG. 3 is a sectional view thereof taken along line in FIG. 2.

Bit lines BL0 to BL2 are extended in the column direction, and word lines WL0 to WL2 are extended to the row direction. Memory cells MC are arranged at intersections of bit lines BL0 to BL2 and word lines WL0 to WL2. Bit lines BL and word lines WL desirably comprise a material high in heat resistance and low in electric resistance. Examples of the material include metals such as W, WSi, Mo, MoSi, NiSi, and CoSi; and carbon materials such as carbon nanotubes, and graphene.

Memory cells MC each comprise variable resistance element VR and capacitor CP connected to each other in series. Over and under variable resistance element VR are arranged electrodes EL2 and EL1, respectively, which function as a barrier metal and an adhesive layer. Similarly, over and under capacitor CP are arranged electrodes EL3 and EL2, respectively, which function as a barrier metal and an adhesive layer.

The positional relationship between capacitor CP and variable resistance element VR may be reverse to the above. Electrode EL2 may include a laminate of an electrode that contacts capacitor CP and an electrode that contacts variable resistance element VR.

Electrodes EL1, EL2, and EL3 may each comprise, for example, Pt, Au, Ag, Cu, Zn, TiAlN, SrRuO, Ru, RuN, Ir, Co, Ti, TiN, TaN, LaNiO, Al, PtIrO$_x$, PtRhO$_x$, Rh, or TaAlN.

Electrodes EL1, El2 and EL3 may each contain a metal film for making the orientation thereof uniformly, or contain a buffer layer, a barrier metal layer, an adhesive layer and/or some other layer. Also, word line WL1 and bit line BL0 may be brought into direct contact with the upper side of capacitor CP, and the lower side of variable resistance element VR, respectively, without interposing electrodes EL1 nor EL3 therebetween. When word line WL 1 directly contacts the upper side of capacitor CP, word line WL1 may comprise Ag, Ni, Co, Pb, Al, Ge, Mo, W, Ti, Fe, Cu, Zn or some other substance.

Variable resistance element VR may be comprised of a material having a resistance value changed through electric current, heat, chemical energy or some other by receiving the application of voltage. Variable resistance element VR may be comprised of, for example, a composite compound containing a cation that is convertible to a transition element, and having a resistance value changed by the shift of the cation.

FIG. 4 shows an example of variable resistance element VR.

Variable resistance element VR is arranged between electrodes EL2 and EL'. For example, electrode EL1 (or EL2) may comprise a p-type Si, the body of variable resistance element VR may comprise amorphous or polycrystalline Si, and electrode EL2 (or EL1) may comprise Ag.

In this case, the initial state of variable resistance element VR is a high resistance state. When electrode EL2 is set into a positive voltage and electrode EL1 is set to a fixed voltage (for example, the ground voltage) lower than the positive voltage, the metal constituting electrode EL2 is ionized to be diffused into the body of variable resistance element VR so that the metal is shifted to the side of electrode EL1. The ionized metal shifted to the electrode EL1 side receives electrons from electrode EL1 to be precipitated as a metal. Thus, metal filament MF is formed.

Metal filament MF is gradually extended from electrode EL1 toward electrode EL2. Thus, the resistance value between electrodes EL1 and EL2 is lowered in inverse proportion to form-factors of metal filament MF, such as the length and thickness thereof. Finally, for example, the tip of metal filament MF contacts electrode EL2 so that variable resistance element VR is transited from a high resistance state to a low resistance state. This is a set operation.

The reset operation for transiting variable resistance element VR from the low resistance state to the high resistance state is attained by applying an electric field having an inverse polarity to the body of variable resistance element VR. At this time, metal filament MF gradually becomes shorter to be separated from electrode EL2. In this way, variable resistance element VR is transited from the low resistance state to the high resistance state.

Examples of the material of electrode EL2 (or EL1), which is an origin of the growth of metal filament MF, include, besides Ag, Fe, Co, Ni, Cu, Ag, Au and Zn. Variable resistance element VR may comprise a semiconductor element such as Si, Ge or C, and a transition metal compound such as HfO$_x$, HfSiO$_x$, MnO$_x$, MnAl$_x$O$_y$, ZnMnO$_x$, NiO$_x$, TiO$_x$ or WO$_x$, or some other material.

Before a description about the operation of the nonvolatile semiconductor memory device of the present example, a description is made about problems of conventional nonvolatile semiconductor memory device using MIM diodes (capacitors) as selectors.

When data is written into memory cells, a writing voltage applied to the memory cell is distributed, in accordance with the capacity value of the capacitor, and the capacity value of the variable resistance element in a high resistance state, into these members. When the variable resistance element is transited from the high resistance state to a low resistance state, most of the writing voltage is concentrated into the capacitor. This is caused by the fact that the memory cell comprises the capacitor and the variable resistance element connected to each other in series.

Almost all of an erasing voltage applied for erasing data is also concentrated into the capacitor during the time when the variable resistance element is transited from the low resistance state to the high resistance state.

In other words, when data is written therein, a high voltage is applied to the capacitor so that an intrinsic leakage current, which is an electric current penetrating through the capacitor, flows. MIM diodes are each a rectifier using such an intrinsic leakage current of a capacitor. However, the diode requires a high voltage for changing the resistance of a variable resistance element. Thus, when the diode has a large current, it is difficult to maintain the reliability of the diode. As a result, the diode may undergo dielectric breakdown.

A description is made about elements each having a variable resistance element and a capacitor, both of which have the same dielectric constant (=10), and each having the same element area (=100 nm$^2$) and the same thickness (=10 nm).

In an element about which any set operation or any reset operation depends on voltage, of the elements described just above, the value of a voltage applied to the capacitor is 5 V when the value of a voltage necessary for the set operation is 5 V. When the variable resistance element is transited from a high resistance state to a low resistance state, most of the voltage applied to the variable resistance element is concentrated into the capacitor so that a voltage of about 10 V is applied to the capacitor.

The value of the electric field applied to the selector becomes a very large value of 10 MV/cm. Thus, the insulating property thereof is not easily maintained. About the reset operation, similarly to the set operation, most of an erasing voltage is concentrated into the capacitor for a predetermined time when the variable resistance element is transited from the low resistance state to the high resistance state. Thus, the insulating property is not easily maintained.

In an element about which any set operation or any reset operation depends on electric current, of the elements, it is supposed that the current quantity necessary for the set operation or reset operation is 10 μA. This value is converted to current density. The resultant current density is a large current density of $10^7$ A/cm$^2$. Because of the current quantity of this large current density, the insulating property of the capacitor is not easily maintained.

As described just above, about a conventional nonvolatile semiconductor memory device, it is understood that the insulating property of its capacitor(s) is not easily kept even when it is supposed that any set operation or reset operation of its variable resistance element(s) depends upon either voltage or current.

Hereinafter, a description is made about the embodiments of the nonvolatile semiconductor memory device for solving such existing problems.

In the present embodiment, the capacity of each of its capacitors CP used as selectors is desirably larger than the capacity of each of its variable resistance elements VR. When the capacity of capacitor CP is larger than that of variable resistance element VR, a relatively large portion of a voltage applied to memory cell MC is distributed to variable resistance element VR while a relatively small portion thereof is distributed to capacitor CP.

In other words, a voltage applied to memory cell MC is effectively distributed to variable resistance element VR, so that the voltage applied to memory cell MC can be controlled to a low value. When variable resistance element VR is transited to, for example, a low resistance state, a voltage necessary for changing the low resistance state of memory cell MC can be controlled to a low value; thus, even when most of the voltage is concentrated into capacitor CP, a dielectric breakdown of capacitor CP can be avoided.

It is conceivable that the method for increasing the capacity of capacitor CP may be a method of spreading the area of the element, making the element into a thin film form or using a high dielectric-constant film, or some other method. When the capacity of capacitor CP is made larger than that of variable resistance element VR by spreading the element area, structures illustrated in FIG. 5 may be adopted.

When capacitor CP is made into a thin film form, the height of the whole memory cell MC can be made short; thus, the aspect ratio of the whole memory cell MC becomes small so that fine processing of the cell is easily attained. Furthermore, when a high dielectric-constant film is used as capacitor CP, the capacity thereof can be increased without making the element area larger.

The high dielectric-constant film may comprise a transition metal oxide such as titanium oxide, zirconium oxide, hafnium oxide or tantalum oxide, a rare earth oxide such as lanthanum oxide or praseodymium oxide, or a material wherein Si, Al, N or some other is mixed therewith. For example, the following may be used as the material of the high dielectric-constant film of capacitor CP: HfSi$_x$O$_y$, HfSi$_x$O$_y$N$_z$, ZrSi$_x$O$_y$, ZrSi$_x$O$_y$N$_z$, LaAl$_x$O$_y$, LaAl$_x$O$_y$N$_z$, LaAl$_x$Si$_y$O$_z$, PrAl$_x$O$_y$, PrAl$_x$O$_y$N$_z$, and PrAl$_x$Si$_y$O$_z$.

Even when a voltage can be effectively distributed into variable resistance element VR of memory cell MC by use of capacitor CP that is a large-capacity capacitor, a reset operation for transiting the low resistance state to the high resistance state cannot be attained merely by the application of a voltage although a set operation for transiting from the high resistance state to the low resistance state can be attained. About the set operation, the operation can be attained when variable resistance element VR is an electric-field-dependent variable resistance element while the operation cannot be attained when variable resistance element VR is a current-dependent variable resistance element.

Thus, a description is made about the operation of the nonvolatile semiconductor memory device for attaining set and reset operations.

OPERATION OF NONVOLATILE SEMICONDUCTOR MEMORY DEVICE

Figure 6:
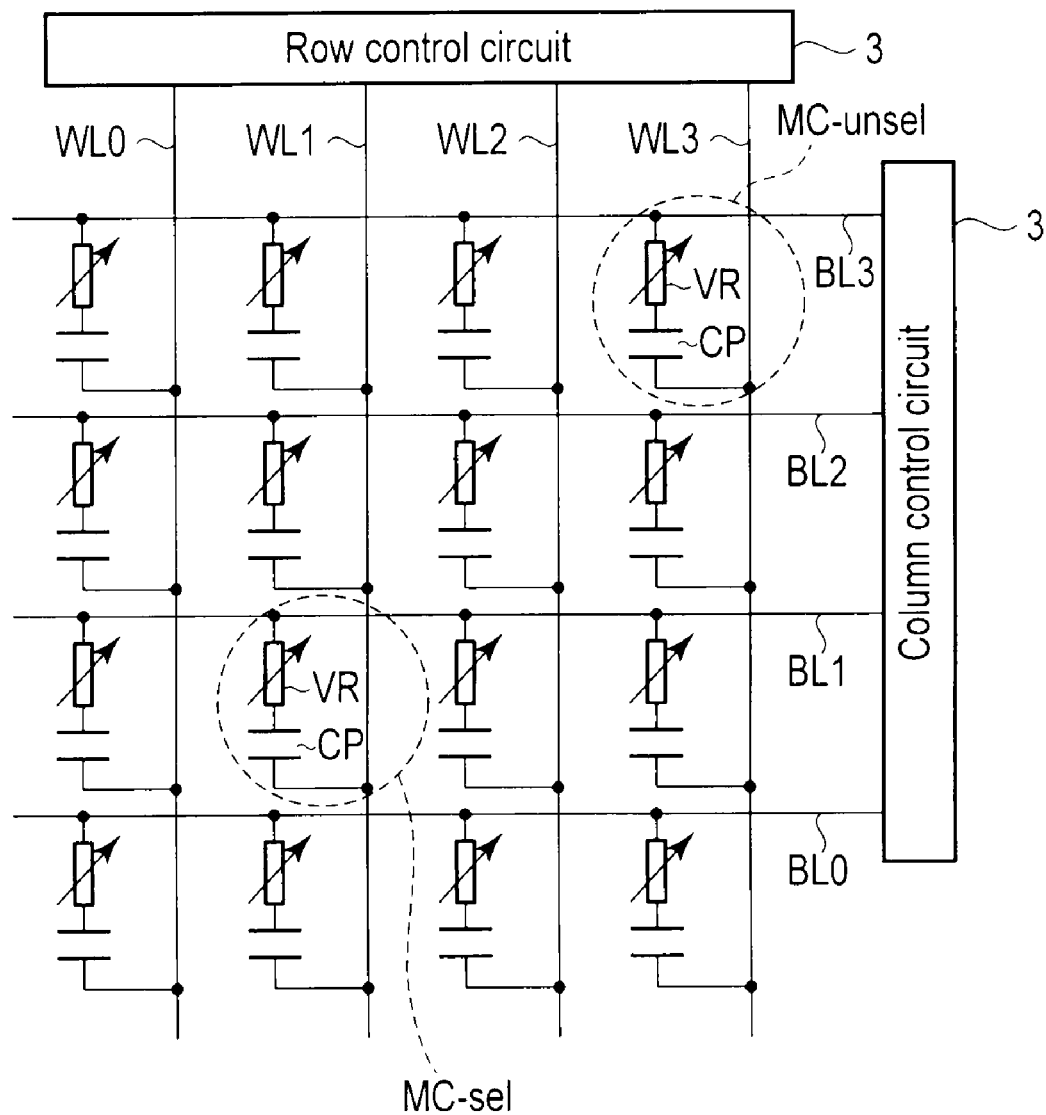
FIG. 6 is a view illustrating an equivalent circuit of a memory cell array.

FIG. 6 is an equivalent circuit of a memory cell array to which the operation related to the present embodiment is applied.

Memory cells MC are each comprised of variable resistance element VR and capacitor CP connected to each other in series. In the present embodiment, variable resistance elements VR are each attached to the sides of BL0 to BL3. Capacitors CP are each attached to the sides of WL0 to WL3. This positional relationship may be reversed.

A selected memory cell which is a target for writing/erasing is represented by MC-sel. At this time, a selected word line is WL1, and a selected bit line is BL1. Column control circuit 2 and row control circuit 3 control voltages of bit lines BL0 to BL3 and word lines WL0 to WL3, thereby writing and erasing data to/from selected memory cell MC-sel.

All the memory cells other than selected memory cell MC-sel are unselected memory cells MC-unsel, which are each not targets for wiring/erasing.

In the meantime, it is known that variable resistance element VR which constitutes each of memory cells MC is classified into two forms. One of the forms is a form in which a high resistance state and a low resistance state can be set by controlling the absolute value of a voltage to be applied, and the period for the application regardless of the polarity of the voltage. This is called the unipolar type or monopolar type. The other is a form in which the polarity of a voltage to be applied is varied, thereby setting a high resistance state and a low resistance state. This is called the bipolar type.

FIG. 7 shows a current-voltage correlation diagram of set/reset operations of a variable resistance element of the unipolar type.

In any data writing operation (set operation), a sufficiently large set voltage |Vset| is applied to variable resistance element VR in selected memory cell MC-sel, thereby changing the resistance value of variable resistance element VR from a high resistance state to a low resistance state.

In the set operation, at the time when variable resistance element VR is changed to the low resistance state, a large current excessively flows into variable resistance element VR so that variable resistance element VR may be completely short-circuited. Thus, required may be so-called compliance, i.e., a current limiter for limiting the value of a current flowing in variable resistance element VR. In (each of) the capacitor(s), which is to be a selector, a charge quantity charged into the capacitor is limited; therefore, the capacitor may function as a current limiter for preventing variable resistance element VR from being short-circuited. The function of this current limiter is the same as in any bipolar element.

In a data erasing operation (reset operation), reset current Irst flows, which is necessary for resetting variable resistance element VR in selected memory cell MC-sel; thus, a sufficiently large reset voltage |Vrst| is applied thereto. Reset voltage |Vrst| needs to be smaller than set voltage |Vset|. In this way, the resistance value of variable resistance element VR changes from the low resistance state to the high resistance state.

FIG. 8 shows a current-voltage correlation diagram of set/reset operations of a variable resistance element of the bipolar type.

In a data writing operation (set operation), for example, positively polar set voltage Vset is applied to variable resistance element VR in selected memory cell MC-sel, thereby changing the resistance value of variable resistance element VR from a high resistance state to a low resistance state.

In a data erasing operation (reset operation), for example, negatively polar reset current −Vrst is applied to variable resistance element VR in selected memory cell MC-sel, thereby changing the resistance value of variable resistance element VR from the low resistance state to the high resistance state.

On the contrary, in the present embodiment, set or reset can be attained through the following operation for a variable resistance element of either the unipolar type or the bipolar type.

In the set operation, set voltage |Vset| is set into variable resistance element VR in selected memory cell MC-sel to render the value thereof, for example, a value not permitting a large quantity of a penetrating current to flow in capacitor CP in selected memory cell MC-sel. In this way, a penetrating current flowing capacitor CP as a selector is decreased so that the nonvolatile semiconductor memory device with high reliability can be realized.

Figure 9:
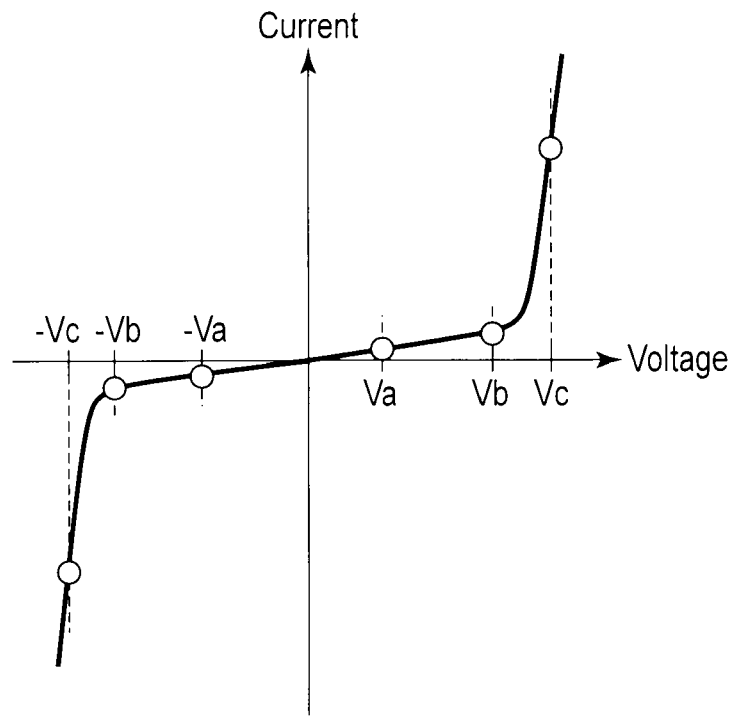
FIG. 9 is a graph showing a current-voltage characteristic of an MIM diode.

As far as a discharge phenomenon from capacitor CP is ensured, a penetrating current is allowed. When capacitor CP comprises an MIM diode, capacitor CP has a current-voltage characteristic as shown in FIG. 9. At this time, set voltage |Vset| may be set to, for example, |Va| in FIG. 9.

For reference, when MIM capacitors are used as selectors in a conventional nonvolatile semiconductor memory device, a range of |Vc| in FIG. 9 is used so that a large penetrating current flows in the MIM capacitors.

In the set operation, electric charge accumulated in capacitor CP is discharged when set voltage |Vset| is lowered. In order to prevent a wrong reset by the discharge, the form of the lowered voltage of set voltage |Vset| is rendered, for example, the form of gentle stairs or a gentle slope.

In the reset operation, a reset current necessary for the reset is attained by a discharge from capacitor CP. First, reset voltage |Vrst| is applied to variable resistance element VR in selected memory cell MC-sel. At this time, no penetrating current is caused to flow in, for example, capacitor CP in selected memory cell MC-sel.

In this way, the penetrating current flowing in capacitor CP, as one of the selectors, is decreased. Thus, the nonvolatile semiconductor memory device with high reliability can be realized. At the same time, electric charge is charged into capacitor CP in selected memory cell MC-sel.

Since the electric charge accumulated in capacitor CP turns to a reset current when the electric charge is discharged, the quantity of the electric charge is desirably as large as possible. For example, it is desired that the capacity of capacitor CP is increased by the structure illustrated in FIG. 5, and further reset voltage |Vrst| is as large as possible.

According to the embodiment, reset voltage |Vrst| can be made larger than set voltage |Vset|. When the current-voltage characteristic shown in FIG. 9 is given as an example, reset voltage |Vrst| can be set to, for example, |Vb| in FIG. 9.

In the reset operation, electric charge accumulated in capacitor CP is discharged when reset voltage |Vrst| is lowered. Since this discharge phenomenon attains the resetting of variable resistance element VR, the form of the lowered voltage of reset voltage |Vrst| is rendered a steep form, for example, a form permitting the voltage to turn into 0 V for 50 ns.

REFERENCE SYMBOLS IN DESCRIPTION OF OPERATION

Reference symbols used in a specific description on the operation of the nonvolatile semiconductor memory device of the embodiment below are first described herein.

Figure 10:
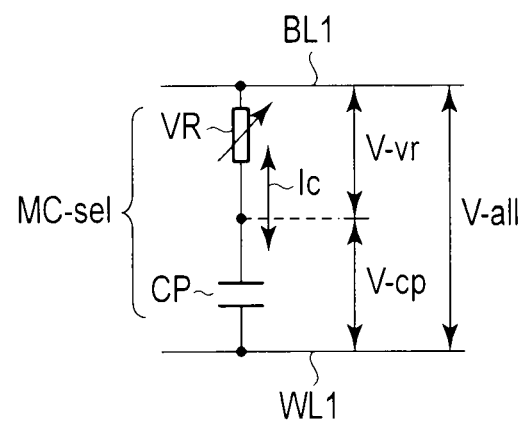
FIG. 10 is a view showing a voltage applied to a selected memory cell.

FIG. 10 illustrates selected memory cell MC-sel.

Selected memory cell MC-sel comprises variable resistance element VR and capacitor CP connected to each other in series between selected bit line BL1 and selected word line WL1.

The entire voltage applied to selected memory cell MC-sel, that is, the voltage between selected bit line BL1 and selected word line WL1 is represented by V-all. A voltage distributed to variable resistance element VR, of the entire voltage V-all, is represented by V-vr, and a voltage distributed to capacitor CP is represented by V-cp.

Charge/discharge current to/from capacitor CP is represented by Ic. It is supposed that variable resistance element VR is turned to two states, that is, a high resistance state and a low resistance state. The resistance value thereof is represented by R-vr.

FIRST EXAMPLE

Figures 11, 12:
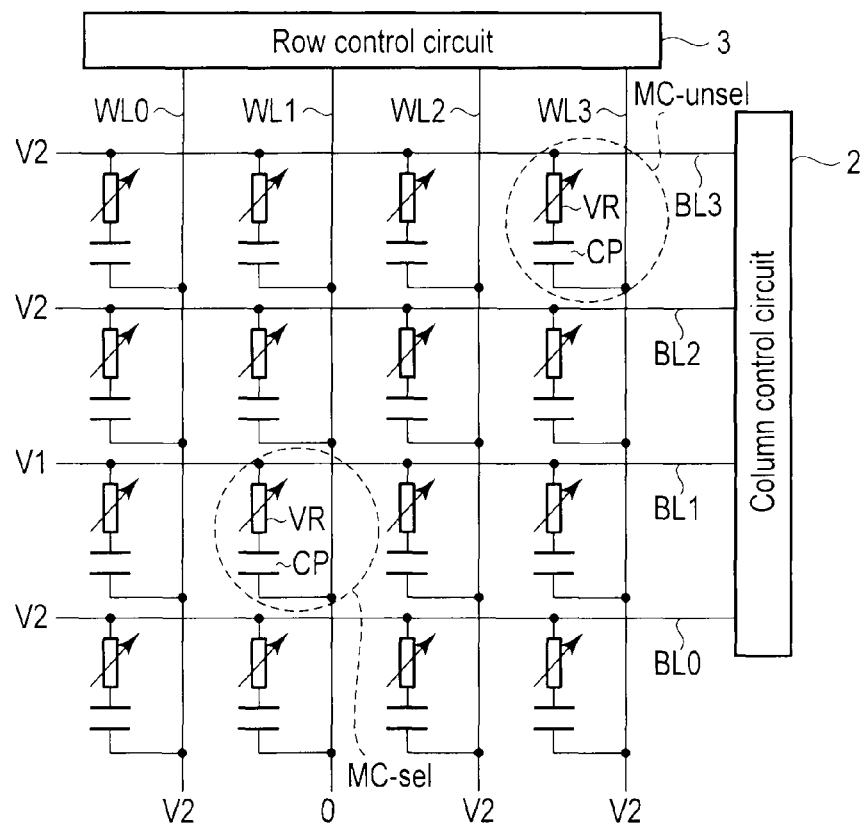
FIG. 11 is a diagram showing a first example of set/reset operations.
FIGS. 12 and 13 are each a view showing a relationship between voltages when the set/reset operation is made.

With reference to FIG. 11, a first example of set/reset operations is described. The first example may be applied to, for example, a bipolar-type variable resistance element.

As illustrated in FIG. 12, in a data-writing (set) operation, column control circuit 2 applies voltage V1 to selected bit line BL1, and applies voltage V2 to each of unselected bit lines BL0, BL2, and BL3. Moreover, row control circuit 3 applies 0 V to selected word line WL1, and applies voltage V2 to each of unselected word lines WL0, WL2, and WL3.

In short, the relationship between the voltages (V1 and V2) is changed from state 1 in FIG. 11 to state 2 therein.

Voltages V1 and V2 are each a positive voltage, and voltage V1 is larger than voltage V2. For example, voltages V1 and V2 have a relationship of V1=2×V2.

In this way, entire voltage V-all applied to selected memory cell MC-sel is set to voltage V1. Thus, variable resistance element VR that is of an electric field depending type is changed from a high resistance state to a low resistance state.

Figure 14:
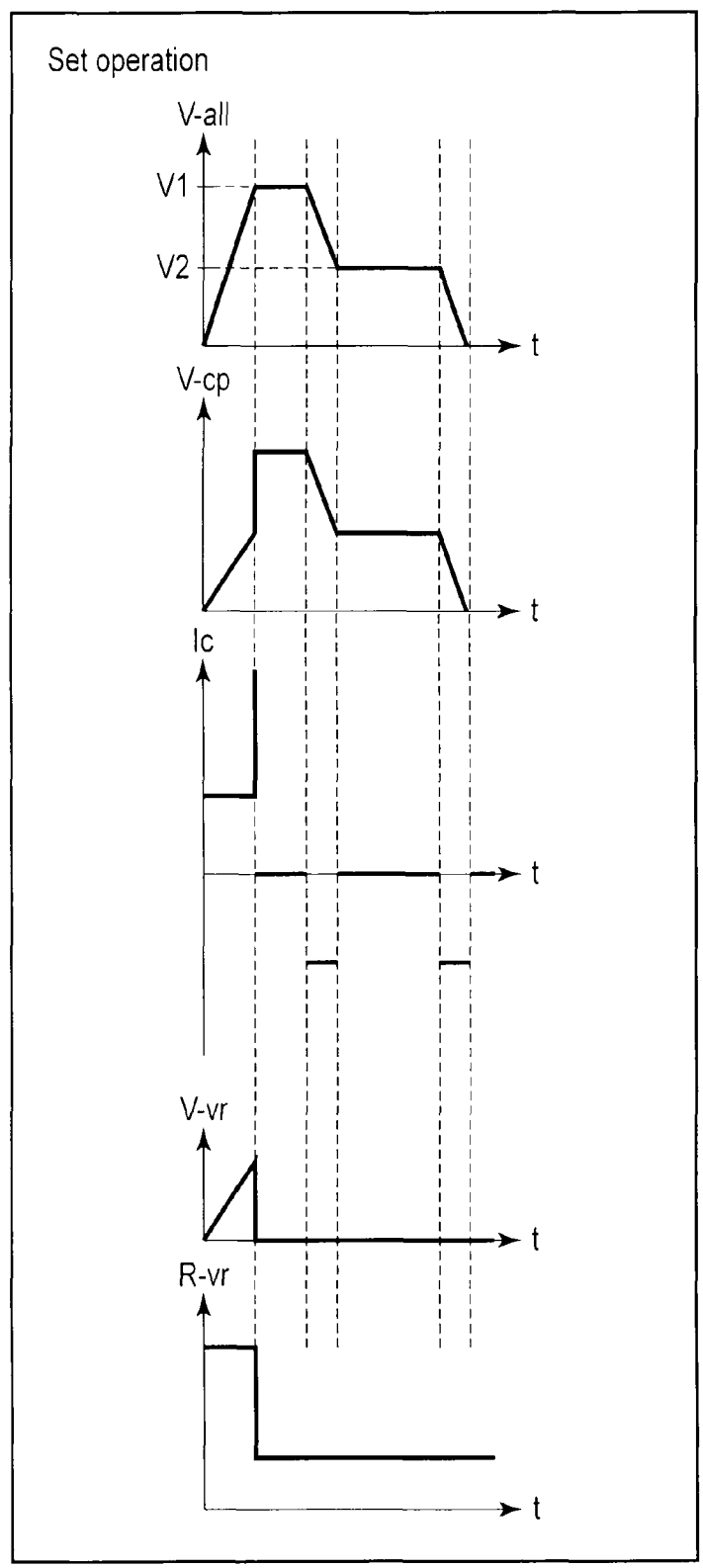

As illustrated in, for example, FIG. 14, when resistance value R-vr of variable resistance element VR is changed from the high resistance state to the low resistance state, most of the entire voltage V-all (=V1) is distributed, as a value of V-cp, into capacitor CP. When the voltage-raising rate in the application of voltage V1 is made large (i.e., the voltage-raising is attained in a short time), transient current Ic based on electric charge flows into selected memory cell MC-sel in a short time. When variable resistance element VR is of a current dependent type, the set operation of memory cells MC can be made by effect of transient current Ic over this short time, that is, in the short time for the voltage-raising.

Figure 13:
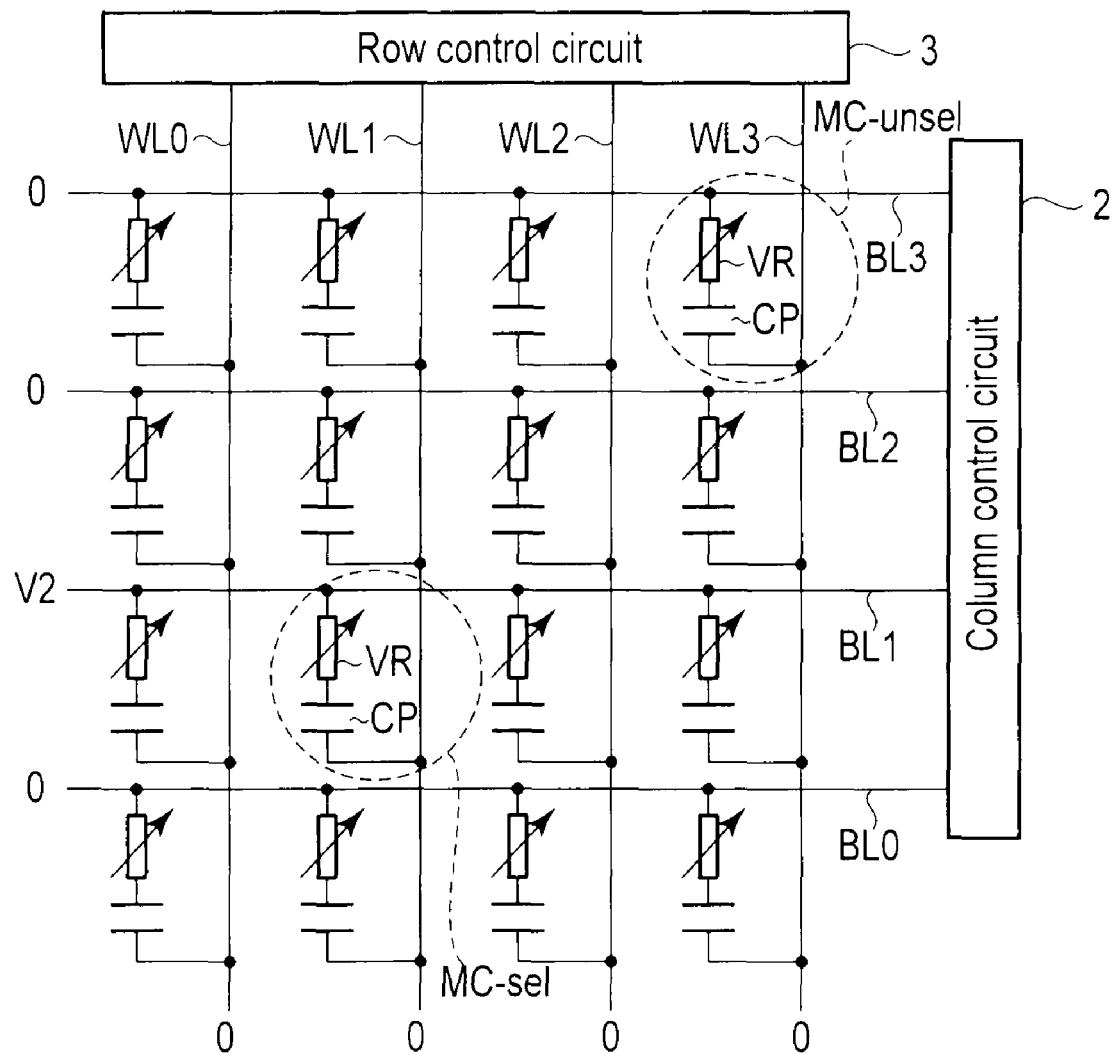

As illustrated in FIG. 13, subsequently, the voltage of selected bit line BL1 is lowered from V1 to V2, and the voltage of each of unselected bit lines BL0, BL2, and BL3 and unselected word lines WL0, WL2, and WL3 is lowered from V2 to 0 V.

In short, the voltage relationship is changed from state 2 in FIG. 11 to state 3 therein.

At this time, about the unselected memory cells connected to unselected word lines WL0, WL2, and WL3, no potential difference is generated between the word lines and the bit lines so that no discharge is caused. However, about the selected memory cell connected to selected word line WL1, discharge is caused from the capacitor so that transient current Ic is generated.

As illustrated in, for example, FIG. 14, when resistance value R-vr of variable resistance element VR of selected memory cell MC-sel is in the low resistance state, discharge current Ic from capacitor CP flows into variable resistance element VR. Since resistance value R-vr of variable resistance element VR is in the low resistance state, a voltage is hardly applied to variable resistance element VR.

However, discharge current Ic from capacitor CP, which is based on the fact that the entire voltage V-all applied to selected memory cell MC-sel is changed from V1 to V2, does not have a discharged quantity sufficient for resetting variable resistance element VR. For this reason, resistance value R-vr of variable resistance element VR in selected memory cell MC-sel can be kept in the low resistance state.

About state 3 in FIG. 11, until the discharge from capacitor CP in selected memory cell MC-sel is finished, this state is maintained.

In state 3 in FIG. 11, after the discharge from capacitor CP in selected memory cell MC-sel is finished, the voltage applied to selected bit line BL1 is lowered from V2 to 0 V.

In short, the voltage relationship is changed from state 3 in FIG. 11 to state 4 therein.

As illustrated in, for example, FIG. 14, at this voltage-lowering time, discharge current Ic flows from capacitor CP in selected memory cell MC-sel to variable resistance element VR therein.

However, discharge current Ic from capacitor CP, which is based on the fact that the entire voltage V-all applied to selected memory cell MC-sel changes V2 to 0 V, does not have a discharged quantity sufficient for resetting variable resistance element VR. For this reason, resistance value R-vr of variable resistance element VR in selected memory cell MC-sel can be kept in the low resistance state.

By the above-mentioned operation, the set operation of selected memory cell MC-sel is finished.

As illustrated in, for example, FIG. 14, in the present example, the trailing edge waveform of the entire voltage V-all applied to selected memory cell MC-sel is rendered a stair form in order to prevent a wrong reset based on discharge from capacitor CP in the set operation. Instead of this form, however, the form may be rendered a slope form as illustrated in, for example, FIG. 15.

For example, in the example illustrated in FIG. 15, discharge current Ic from capacitor CP, which is based on the fact that the entire voltage V-all is changed from V1 to 0 V, does not have a discharged quantity sufficient for resetting variable resistance element VR. For this reason, resistance value R-vr of variable resistance element VR in selected memory cell MC-sel can be kept in the low resistance state.

In state 3 in FIG. 11, data may be read out by use of voltage V2 as a reading voltage. When there is caused a risk that variable resistance elements VR may be wrongly reset in accordance with unevenness in these elements, a so-called verification may be performed after data is read out from variable resistance element VR, the operation being an operation that a voltage is again applied to variable resistance element VR, thereby returning the element into the set state.

Secondary, in a data erasing (reset) operation, as illustrated in FIG. 12, column control circuit 2 first applies voltage V1 to selected bit line BL1, and applies voltage V2 to each of unselected bit lines BL0, BL2, and BL3. Moreover, row control circuit 3 applies voltage 0 V to selected word line WL1, and applies voltage V2 to each of unselected word lines WL0, WL2, and WL3.

In short, the voltage relationship is changed from state 1 in FIG. 11 to state 2 therein.

This voltage relationship is equivalent to that in the set operation. However, no problem is caused when the reset operation is made.

Thereafter, state 3 in FIG. 11 is skipped, and state 2 is immediately changed to state 4.

Figure 16:
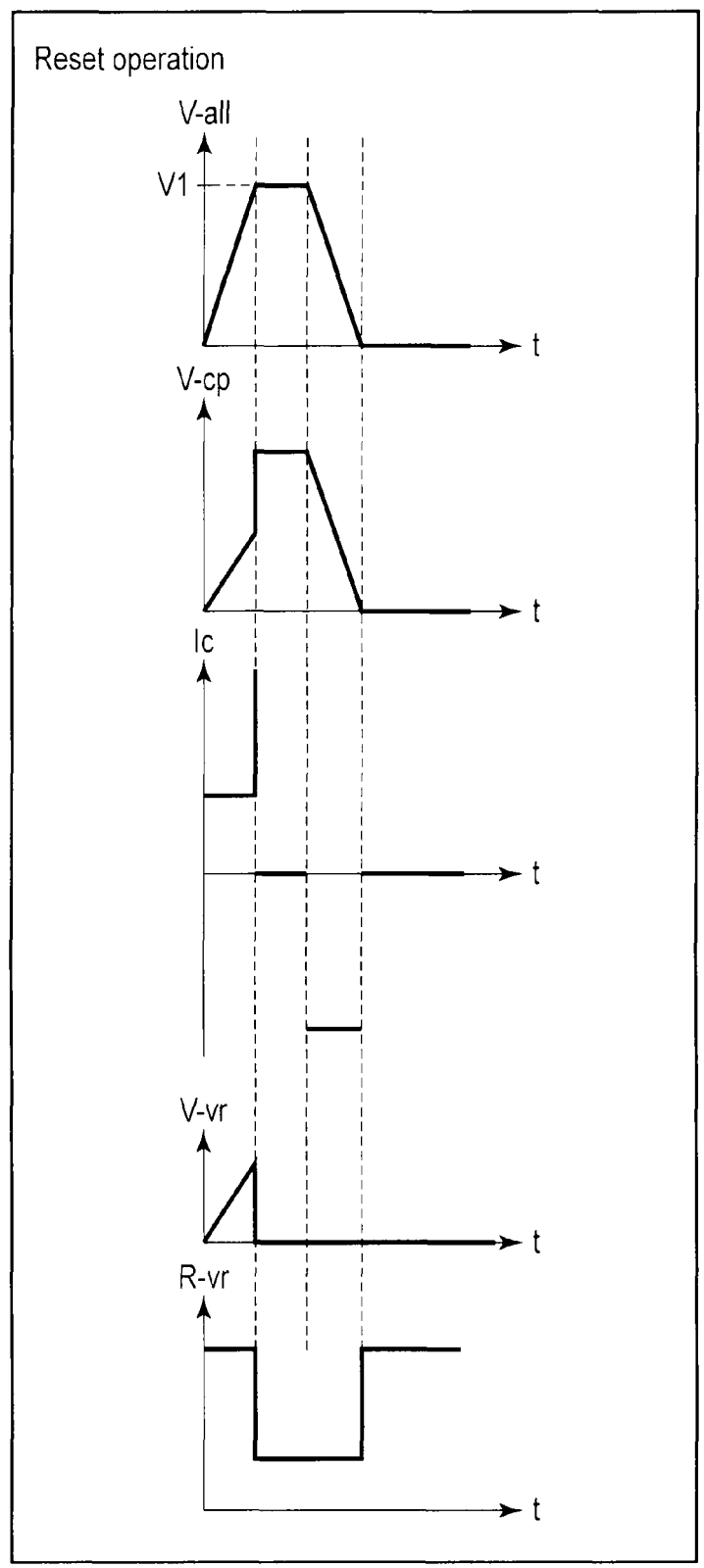
FIG. 16 is a waveform chart referred to in order to describe the reset operation.

Specifically, as illustrated in, for example, FIG. 16, the entire voltage V-all applied to selected memory cell MC-sel is quickly set to 0 V in a short time. In this way, electric charge accumulated in capacitor CP in selected memory cell MC-sel is discharged in a short time.

At this time, voltage V2 is applied to unselected memory cells MC-unsel. However, unselected memory cells MC-unsel do not have a potential difference for generating a resistance change based on discharge. Thus, data in unselected memory cells MC-unsel are not erased.

Discharge current Ic from capacitor CP which is based on the fact that the entire voltage V-all applied to selected memory cell MC-sel is lowered from V1 to 0 V has a discharged quantity sufficient for resetting variable resistance element VR. For this reason, resistance value R-vr of variable resistance element VR in selected memory cell MC-sel changes from the low resistance state to the high resistance state.

By the above-mentioned operation, the reset operation of selected memory cell MC-sel is finished.

In the present example, voltage V2 is ½ of voltage V1; however, voltage V2 is not limited thereto as far as the value is a value not permitting variable resistance element VR to be reset. When the entire voltage V-all applied to selected memory cell MC-sel is lowered in a stair form, the voltage is lowered at two steps in the example. However, the voltage may be lowered at three or more steps.

When entire voltage V-all is lowered into a stair or slope form, the following prerequisite condition is required: the discharged from capacitor CP can be followed. This is because when the discharge from capacitor CP cannot be followed, the electric charge quantity discharged from capacitor CP causes selected memory cell MC-sel to be reset, as has been described in connection with the reset operation.

The wording "discharge can be followed" herein means that with respect to the voltage quantity which falls in a predetermined time after the lowering in the voltage (for voltage-lowering into a stair form) or in a predetermined time (for voltage-lowering into a slope form), all of the electric charge quantity discharged from capacitor CP by effect of the trailing voltage is discharged in the predetermined time. In other words, when the discharge from capacitor CP can be followed in the lowering in the voltage, the discharge from capacitor CP can be ended at once if the discharge is stopped in the middle of discharging.

In the present example, the writing (set) voltage and the erasing (reset) voltage applied to selected memory cell MC-sel are each V1; however, the two may be different from each other. A larger discharge current can be used, in particular, by making the erasing voltage larger than the writing voltage; therefore, the erasing operation can be made faster. By making the erasing voltage larger than the writing voltage, a variable resistance element necessary for a larger discharge current can also be used.

In the first example, capacitor CP larger in capacity than variable resistance element VR in the high resistance state is used in the selector in each of the memory cells. According to this, the voltage applied for rewriting data is effectively distributed to variable resistance element VR, thereby making it possible to control the voltage applied to the whole memory cell to a low value and further decrease an intrinsic leakage current, which is a current penetrating through capacitor CP.

Accordingly, when data is rewritten into memory cell MC, the selector can be prevented from having deteriorated reliability and undergoing dielectric breakdown. As a result, the nonvolatile semiconductor memory device with high reliability can be realized.

In a cross-point type nonvolatile semiconductor memory device using conventional bipolar-type variable resistance elements, it is necessary that at the times of set and reset operations, voltages having reverse polarities are applied, respectively, between word lines and bit lines. Thus, it is necessary to set, in a peripheral circuit other than its memory cell array, a control circuit for generating voltages having reverse polarities.

However, according to the first example, at the times of set and reset operations, a discharge phenomenon from capacitor CP in the memory cells is used. It is therefore unnecessary to set, in a peripheral circuit, a control circuit for generating voltages having reverse polarities. For this reason, the area of the peripheral circuit of the nonvolatile semiconductor memory device can be made small, and further the area of a chip thereof can also be made small.

The discharge current from capacitor CP in unselected memory cells charged at potential difference V2 does not reach the current quantity permitting variable resistance element VR to be set. Thus, when data is written or the data is erased, no inconvenience is caused.

SECOND EXAMPLE

With reference to FIG. 17, a description is made about a second example of the set/reset operations in the embodiment. The second example may be applied to, for example, a monopolar-type variable resistance element.

As illustrated in FIG. 12, in a data-writing (set) operation, column control circuit 2 first applies voltage V1 to selected bit line BL1, and applies voltage V2 to each of unselected bit lines BL0, BL2, and BL3. Moreover, row control circuit 3 applies 0 V to selected word line WL1, and applies voltage V2 to each of unselected word lines WL0, WL2, and WL3.

In short, the relationship between the voltages of the lines is changed from state 1 in FIG. 11 to state 2 therein.

In the same manner as in the first example, the entire voltage V-all applied to selected memory cell MC-sel is set to voltage V1, whereby variable resistance element VR therein is changed from a high resistance state to a low resistance state. However, voltage V1 needs to be equal to or more than set voltage |Vset| in, for example, FIG. 7.

Subsequently, as illustrated in FIG. 13, the voltage of selected bit line BL1 is lowered from V1 to V2, and each of unselected bit lines BL0, BL2, and BL3, and unselected word lines WL0, WL2, and WL3 is lowered from V2 to 0 V.

In short, the voltage relationship is changed from state 2 in FIG. 11 to state 3 therein.

At this time, about the unselected memory cells connected to unselected word lines WL0, WL2, and WL3, no potential difference is generated between the word lines and the bit lines so that no discharge is caused. However, about the selected memory cell connected to selected word line WL1, discharge is caused.

A different point between the second example and the first example is that voltage V1−V2 is smaller than reset voltage |Vrst|.

Specifically, in the same manner as in the first example, a prerequisite condition of the present example is that the writing voltage (set voltage) is lowered at two steps; therefore, when voltage V1−V2 is equal to or more than reset voltage |Vrst| at the first step in the voltage-lowering, a wrong reset is caused by the effect of discharge current Ic from capacitor CP, which is generated at the voltage-lowering time.

Thus, voltage V1−V2 is set as follows: V1−V2<|Vrst|. In this way, discharge current Ic from capacitor CP, which is based on the fact that entire voltage V-all applied to selected memory cell MC-sel is changed from V1 to V2, does not have a discharged quantity sufficient for resetting variable resistance element VR. For this reason, resistance value R-vr of variable resistance element VR in selected memory cell MC-sel can be kept in the low resistance state.

Subsequently, in state 3 in FIG. 11, the voltage applied to selected bit line BL1 is lowered from V2 to 0 V after the discharge from capacitor CP in selected memory cell MC-sel is finished.

In short, the voltage relationship is changed from state 3 in FIG. 11 to state 4 therein.

At this voltage-lowering time, discharge current Ic flows from capacitor CP in selected memory cell MC-sel to variable resistance element VR therein.

A different point between the second example and the first example is that V2 is smaller than reset voltage |Vrst| in, for example, FIG. 7.

Specifically, as described above, a prerequisite condition of the present example is that the writing voltage (set voltage) is lowered at two steps; therefore, if voltage V2 is equal to or more than reset voltage |Vrst| at the second step in the voltage-lowering, a wrong reset is caused by the effect of discharge current Ic from capacitor CP, which is generated at the voltage-lowering time.

Thus, voltage V2 is set as follows: V2<|Vrst|. In this way, discharge current Ic from capacitor CP, which is based on the fact that the entire voltage V-all applied to selected memory cell MC-sel is changed from V2 to 0 V, does not have a discharged quantity sufficient for resetting variable resistance element VR. For this reason, resistance value R-vr of variable resistance element VR in selected memory cell MC-sel can be kept in the low resistance state.

By the above-mentioned operation, the set operation of selected memory cell MC-sel is finished.

In the present example, the writing voltage (set voltage) is lowered at two steps; however, the voltage may be lowered at 3 or more steps. When the writing voltage is lowered at two or more steps, the lowering quantity of the voltage at each of the steps needs to be less than Vrst.

When the writing voltage is lowered not in a stair form but in a slope form, discharge current Ic from capacitor CP that is generated while the writing voltage is lowered needs to be constantly less than reset voltage Irst necessary for reset.

Secondly, in a data erasing (reset) operation, as illustrated in FIG. 18, column control circuit 2 first applies voltage V1' to selected bit line BL1, and applies voltage V3 to each of unselected bit lines BL0, BL2, and BL3. Moreover, row control circuit 3 applies 0 V to selected word line WL1, and applies voltage V3 (V1'>V3) to each of unselected word lines WL0, WL2, and WL3.

In short, the relationship of the voltages of the lines is changed from state 1 in FIG. 17 to state 2 therein.

Here, voltage V1' needs to be equal to or more than reset voltage |Vrst| in FIG. 7, and be less than set voltage |Vset|. Moreover, the following needs to be satisfied in order not to cause a wrong reset in unselected memory cells MC-unsel: V1'−V3<|Vrst|, and V3<|Vrst|.

Thereafter, state 3 in FIG. 11 is skipped, and state 2 is immediately changed to state 4.

Specifically, entire voltage V-all applied to selected memory cell MC-sel is quickly set to 0 V in a short time. In this way, electric charge accumulated in capacitor CP in selected memory cell MC-sel is discharged in a short time.

At this time, voltage V1'−V3, or V3 is applied to unselected memory cells MC-unsel. However, unselected memory cells MC-unsel do not have a potential difference for generating a resistance change based on discharge. Thus, data in unselected memory cells MC-unsel are not erased.

Discharge current Ic from capacitor CP, which is based on the fact that the entire voltage V-all applied to selected memory cell MC-sel is lowered from V1' to 0 V, has a discharged quantity sufficient for resetting variable resistance element VR. For this reason, resistance value R-vr of variable resistance element VR in selected memory cell MC-sel changes from the low resistance state to the high resistance state.

By the above-mentioned operation, the reset operation of selected memory cell MC-sel is finished.

According to the second example, the same advantageous effects as according to the first example can be obtained. Moreover, according to the second example, data can be rewritten by discharge from capacitor CP even when variable resistance element VR is of the monopolar type.

THIRD EXAMPLE

Figures 19, 20:
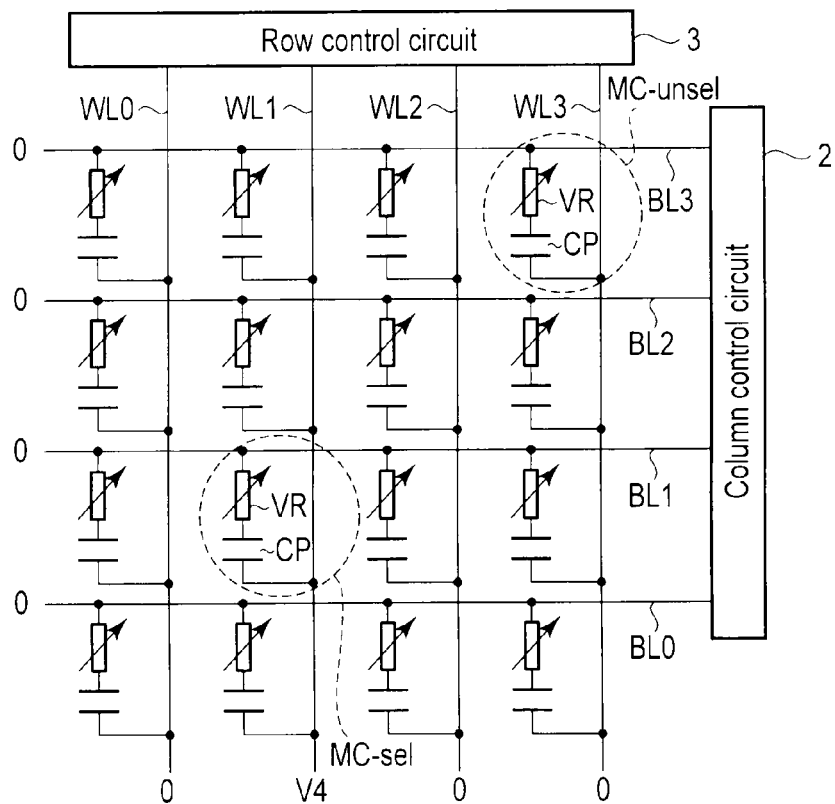
FIG. 19 is a diagram showing a third example of the set/reset operations.
FIG. 20 is a view showing a relationship between voltages when the reset operation is made.

With reference FIG. 19, a description is made about a third example of the set/reset operations in the embodiment. The third example is a modified example of the first example.

Any data writing (set) operation is the same as in the first example; thus, a detailed description thereon is omitted herein. The third example is characterized by data erasing (reset) operation.

As illustrated in FIG. 12, in the reset operation, column control circuit 2 first applies voltage V1 to selected bit line BL1, and applies voltage V2 to each of unselected bit lines BL0, BL2, and BL3. Moreover, row control circuit 3 applies 0 V to selected word line WL1, and applies voltage V2 to each of unselected bit lines WL0, WL2, and WL3.

In short, the relationship between the voltages of the lines is changed from state 1 in FIG. 19 to state 2 therein.

Thereafter, state 3 in FIG. 19 is skipped, and state 2 is immediately changed to state 4.

Specifically, as illustrated in, for, example, FIG. 20, the entire voltage V-all applied to selected memory cell MC-sel is quickly lowered in a short time. In this way, electric charge accumulated in capacitor CP in selected memory cell MC-sel is discharged in a short time.

At this time, the voltage of selected bit line BL1 is changed from voltage V1 to 0 V, and the voltage of each of unselected bit lines BL0, BL2, and BL3, and unselected word lines WL0, WL2, and WL3 is changed from voltage V2 to 0 V. The voltage of selected word line WL1 is changed from 0 V to voltage V4.

Selected memory cell MC-sel is referred to next. In, for example, state 2, the selected bit line BL1 side thereof has voltage (V1) of positive polarity. By contrast, in state 4, the selected word line WL1 side thereof has positive voltage (V4) of positive polarity. In short, voltages having polarities reverse to each other are applied to selected memory cell MC-sel in states 2 and 4, respectively.

Accordingly, the third example makes use of the following two phenomena when the reset operation is made: a discharge phenomenon from capacitor CP which is based on the fact that positive voltage V1 (when the voltage of selected bit line BL1 side is positive) which is applied to selected memory cell MC-sel is set to 0 V; and a charge phenomenon into capacitor CP which is based on the fact that negative voltage V4 (when the voltage of selected word line WL1 is positive) is applied to selected memory cell MC-sel subsequently to the discharge phenomenon.

As a result, the change quantity of the voltage applied to selected memory cell MC-sel is V1+V4. A transient response current dependent on the potential difference can be used for the reset operation of variable resistance element VR. In this way, the voltage applied to selected memory cell MC-sel can be further decreased.

Although voltage V2 is applied to unselected memory cells MC-unsel, data in unselected memory cells MC-unsel are not erased since unselected memory cells MC-unsel do not have a potential difference for generating a resistance change based on discharge.

By the above-mentioned operation, the reset operation of selected memory cell MC-sel is finished.

According to the third example, the same advantageous effects as according to the first example can be obtained. Moreover, according to the third example, for example, the voltage applied to capacitor CP is continuously changed from positive polarity (or negative polarity) to negative polarity (or positive polarity), thereby making it possible to use a discharge phenomenon and a charge phenomenon based on these reverse-polarity voltages to generate a reset current (charge and discharge currents into/from capacitor CP).

Accordingly, the absolute value of the voltage applied to selected memory cell MC-sel can be decreased so that a booster circuit can be partially or entirely omitted in the peripheral circuit. As a result, the area of the peripheral circuit can be decreased. Finally, the area of the chip can be made small.

MODIFIED EXAMPLES OF SET/RESET PULSES

A description is made about modified examples of the set/reset pulses used in the embodiment.

In a set operation in the embodiment, FIGS. 21A and 21C each illustrate the set pulses used in the first to third examples. In the meantime, FIG. 21B illustrates a set pulse (writing voltage) having a voltage trailing edge waveform made into a three-step form (stair form). FIG. 21D illustrates a set pulse (writing voltage) having a voltage trailing edge waveform changed in the middle of the trailing.

In a reset operation therein, FIG. 21A illustrates the reset pulses used in the first and second examples, and FIG. 21D illustrates the reset pulses used in the third example. In the meantime, FIG. 21B illustrates a reset pulse (erasing voltage)

having a voltage trailing edge waveform made into a two-step form (stair form). In the first voltage trailing (represented by ×1), a reset operation is made. FIG. 21C illustrates a reset pulse (erasing voltage) having a voltage trailing edge waveform made into a two-step form (stair form). In the last voltage trailing (represented by ×2), a reset operation is made.

Figure 21:
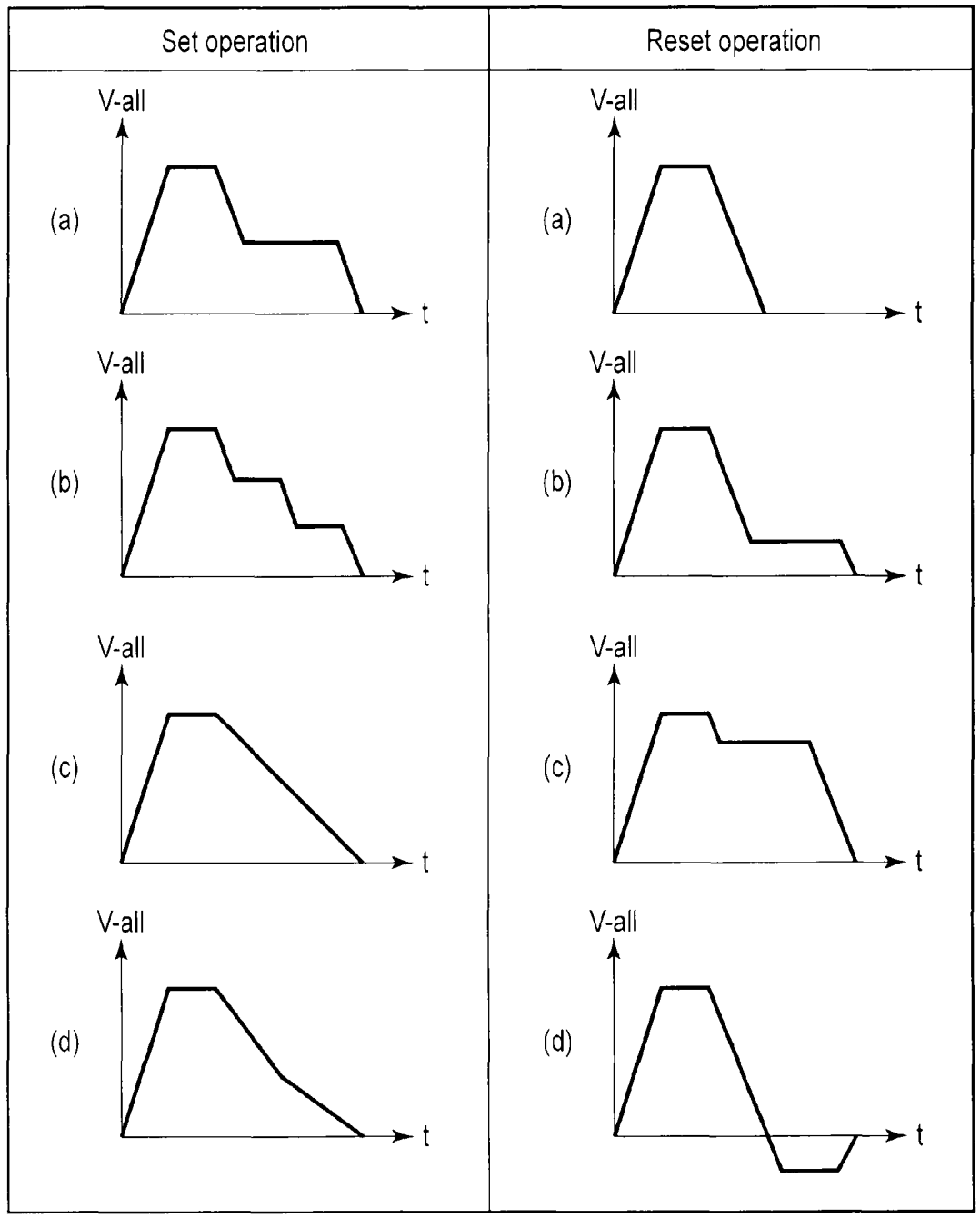
FIG. 21 is a chart illustrating modified examples of set/reset pulses.

As has been illustrated in FIG. 21, in the present embodiment, a portion of a set pulse in which the steepest voltage-trailing is attained is gentler than a portion of the reset pulse (corresponding thereto) in which the steepest voltage-trailing is attained.

OTHER

The above has described embodiments. However, the embodiments are not limited thereto. The embodiments may be variously changed or added to, or two or more embodiments thereof may be combined with each other as far as the results do not depart from the scope of the subject matter of the embodiments.

For example, the time necessary for the leading of a voltage pulse for erasing (resetting) data, and the time necessary for the trailing thereof may be equal to each other, or may be different from each other.

The time necessary for the leading of a voltage pulse for a set operation, and that necessary for the leading of a voltage pulse for a reset operation may be equal to each other, or may be different from each other. When the two are made different from each other, the time necessary for the leading of the voltage pulse in the reset operation may be made shorter than that in the set operation. The reset can be attained by discharge current generated when the voltage pulse rises in the reset operation.

Furthermore, for a set or reset operation, only one set or reset pulse is not always used. The set or reset of variable resistance element VR may be performed by giving voltage pulses continuously to the element in either one of set and reset operations.

CONCLUSION

According to the embodiments, a current penetrating through a selector in a memory cell or each memory cell can be decreased when data is rewritten.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   first and second conductive lines intersecting each other;
   a memory cell comprising a variable resistance element and a capacitor connected in series between the first and second conductive lines; and
   a control circuit applying one of first and second voltage pulses to the memory cell,
   wherein the capacitor is charged by a leading edge of one of the first and second voltage pulses, and discharged a trailing edge of one of the first and second voltage pulses,
   wherein the control circuit makes the trailing edge waveforms of the first and second voltage pulses be different, changes a resistance value of the variable resistance element from a first resistance value to a second resistance value lower than the first resistance value by using the first voltage pulse, and changes the resistance value of the variable resistance element from the second resistance value to the first resistance value by using the second voltage pulse.

2. The device of claim 1, wherein capacity of the capacitor is larger than capacity of the variable resistance element when the variable resistance element is in a high resistance state.

3. The device of claim 1, wherein the trailing time of the second voltage pulse is shorter than that of the first voltage pulse.

4. The device of claim 3, wherein the trailing edge waveform of the first voltage pulse is one of a stair form and a slope form.

5. The device of claim 1, wherein the control circuit makes the trailing edge waveform of the first voltage pulse into the form of stairs including first and second steps, and makes use of a discharge current from the capacitor that is generated when the first voltage pulse is shifted from the first step to the second step, thereby verifying whether or not the variable resistance element has the second resistance value.

6. The device of claim 1, wherein the control circuit makes the trailing edge waveform of the first voltage pulse into the form of stairs including first and second steps, and makes use of a discharge current from the capacitor that is generated when the first voltage pulse is shifted from the first step to the second step, thereby changing the resistance value of the variable resistance element to the second resistance value.

7. The device of claim 6, wherein the trailing edge waveform of the first voltage pulse includes third and fourth steps, and the control circuit makes use of a discharge current from the capacitor that is generated when the first voltage pulse is shifted from the third step to the fourth step, thereby verifying whether or not the variable resistance element has the first resistance value.

8. The device of claim 7, wherein the third step is equal to the second step.

9. The device of claim 1, wherein the variable resistance element comprises first and second electrodes, and a variable resistance material between these electrodes, and the resistance value of the variable resistance element is decided by a filament formed between the first and second electrodes and having the same element as the first electrode has.

10. The device of claim 1, wherein the variable resistance element comprises first and second electrodes, and a variable resistance material between these electrodes, and the variable resistance material is amorphous silicon, polycrystalline silicon or a metal sulfide.

11. The device of claim 1, wherein in the capacitor, the following is used as a high dielectric-constant film: an oxide containing at least one of Ti, Zr, Hf, Ta, La and Pr; or a material in which at least one of Si, Al and N is mixed with the oxide.

12. The device of claim 1,
wherein the resistance value of the variable resistance element is changed to the second resistance value by transient response of the capacitor caused by the leading edge of the first voltage pulse.

13. The device of claim 1,
wherein the resistance value of the variable resistance element is changed to the first resistance value by transient response of the capacitor caused by the leading edge of the second voltage pulse.

14. The device of claim 1,
wherein the variable resistance element is of a bipolar type in which voltages different from each other in polarity are used to control a change from the first resistance value to the second resistance value, and a change from the second resistance value to the first resistance value.

15. The device of claim 1,
wherein the variable resistance element is of a monopolar or unipolar type in which voltages equal to each other in polarity are used to control a change from the first resistance value to the second resistance value, and a change from the second resistance value to the first resistance value.

16. The device of claim 1,
wherein distance between electrodes in the capacitor is thinner than that in the variable resistance element.

* * * * *